United States Patent
Quinn et al.

(10) Patent No.: US 10,998,531 B2
(45) Date of Patent: May 4, 2021

(54) SEGMENTED OVJP PRINT BAR

(71) Applicant: Universal Display Corporation, Ewing, NJ (US)

(72) Inventors: William E. Quinn, Whitehouse Station, NJ (US); Gregory McGraw, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 25 days.

(21) Appl. No.: 16/184,105

(22) Filed: Nov. 8, 2018

(65) Prior Publication Data

US 2019/0181390 A1 Jun. 13, 2019

Related U.S. Application Data

(60) Provisional application No. 62/597,605, filed on Dec. 12, 2017.

(51) Int. Cl.
*H01L 51/56* (2006.01)
*H01L 51/50* (2006.01)
(Continued)

(52) U.S. Cl.
CPC .............. *H01L 51/56* (2013.01); *B41J 2/04* (2013.01); *B41J 2/155* (2013.01); *B41J 25/3086* (2013.01);
(Continued)

(58) Field of Classification Search
None
See application file for complete search history.

(56) References Cited

U.S. PATENT DOCUMENTS

| 4,769,292 A | 9/1988 | Tang |
| 5,247,190 A | 9/1993 | Friend |

(Continued)

FOREIGN PATENT DOCUMENTS

| JP | 2011126082 A | 6/2011 |
| WO | 2008057394 A1 | 5/2008 |
| WO | 2010011390 A2 | 1/2010 |

OTHER PUBLICATIONS

Extended EP Search Report for App. No. 18210722.7, dated May 8, 2019, 8 pages.

(Continued)

*Primary Examiner* — Moazzam Hossain
*Assistant Examiner* — Stanetta D Isaac
(74) *Attorney, Agent, or Firm* — Butzel Long

(57) ABSTRACT

Implementations of the disclosed subject matter provide a print bar for organic vapor jet (OVJP) deposition is provided that includes a plurality of n print head segments, where each of the plurality of print head segments may have an OVJP print head. The print bar may include a plurality of distance sensors, where each of the plurality of distance sensors may be configured to measure a distance between a substrate disposed below the print bar and a portion of at least one of the print head segments. The print bar may include a plurality of not more than n+1 actuators configured to adjust at least one of a position and an orientation of one or more of the plurality of print head segments based upon one or more distances between the substrate and the print bar measured by one or more of the plurality of distance sensors.

20 Claims, 9 Drawing Sheets

(51) Int. Cl.
*H01L 51/00* (2006.01)
*C23C 14/22* (2006.01)
*B41J 2/04* (2006.01)
*B41J 2/155* (2006.01)
*C23C 14/04* (2006.01)
*C23C 14/12* (2006.01)
*B41J 25/316* (2006.01)
*B41J 25/308* (2006.01)

(52) U.S. Cl.
CPC ............ *B41J 25/316* (2013.01); *C23C 14/04* (2013.01); *C23C 14/12* (2013.01); *C23C 14/228* (2013.01); *H01L 51/001* (2013.01); *H01L 51/0008* (2013.01); *H01L 51/5012* (2013.01); *B41J 2202/20* (2013.01); *H01L 2251/5353* (2013.01)

(56) References Cited

U.S. PATENT DOCUMENTS

| | | | |
|---|---|---|---|
| 5,703,436 A | 12/1997 | Forrest | |
| 5,707,745 A | 1/1998 | Forrest | |
| 5,834,893 A | 11/1998 | Bulovic | |
| 5,844,363 A | 12/1998 | Gu | |
| 6,013,982 A | 1/2000 | Thompson | |
| 6,087,196 A | 7/2000 | Sturm | |
| 6,091,195 A | 7/2000 | Forrest | |
| 6,097,147 A | 8/2000 | Baldo | |
| 6,294,398 B1 | 9/2001 | Kim | |
| 6,303,238 B1 | 10/2001 | Thompson | |
| 6,337,102 B1 | 1/2002 | Forrest | |
| 6,468,819 B1 | 10/2002 | Kim | |
| 7,279,704 B2 | 10/2007 | Walters | |
| 7,431,968 B1 | 10/2008 | Shtein | |
| 7,968,146 B2 | 6/2011 | Wagner | |
| 8,915,575 B1 | 12/2014 | Kasiske, Jr. | |
| 2003/0230980 A1 | 12/2003 | Forrest | |
| 2004/0174116 A1 | 9/2004 | Lu | |
| 2014/0131667 A1 | 5/2014 | Chang | |
| 2015/0158294 A1 | 6/2015 | Koide | |
| 2015/0380648 A1* | 12/2015 | McGraw | C23C 14/04 257/40 |
| 2017/0101711 A1 | 4/2017 | McGraw | |
| 2017/0229663 A1 | 8/2017 | Tsai | |

OTHER PUBLICATIONS

Baldo et al. Highly efficient phosphorescent emission from organic electroluminescent devices, Nature, vol. 395, pp. 151-154, 1998.

Baldo, et al., "Very high-efficiency green organic light-emitting devices based on electrophosphorescence", Applied Physics Letters, Jul. 5, 1999, 4 pages, vol. 75, No. 1, American Institute of Physics, Melville, NY, USA.

Corning, "Lotus(TM) NXT Glass", 2015.

Extended EP Search Report for App No. 18170648.2 dated Oct. 2, 2018, 8 pages.

Extended European Search Report for Application No. EP20155632.1, dated Mar. 18, 2020, 7 pages.

Extended European Search Report for Application No. EP19206864.1, dated Mar. 18, 2020, 8 pages.

* cited by examiner

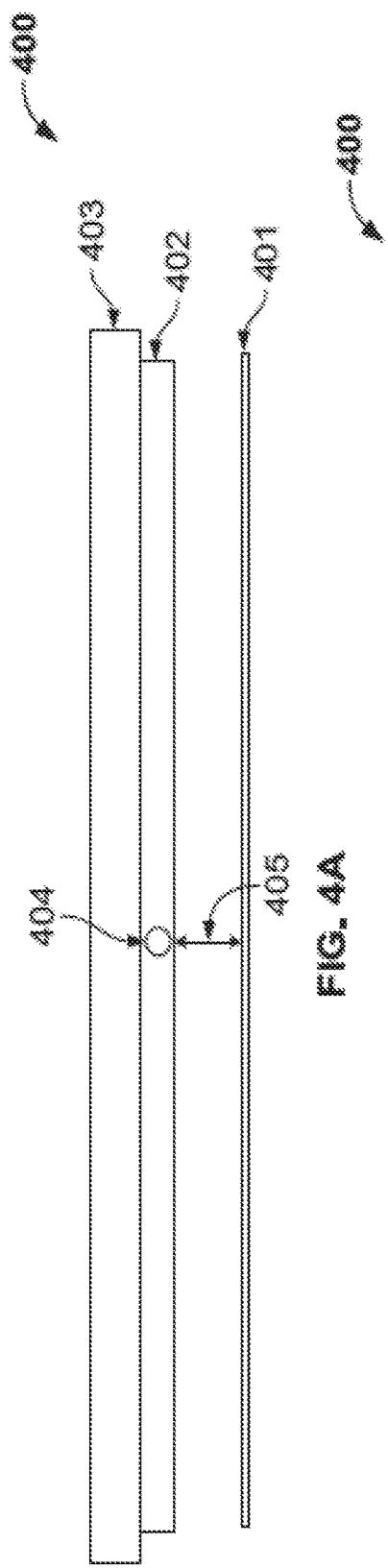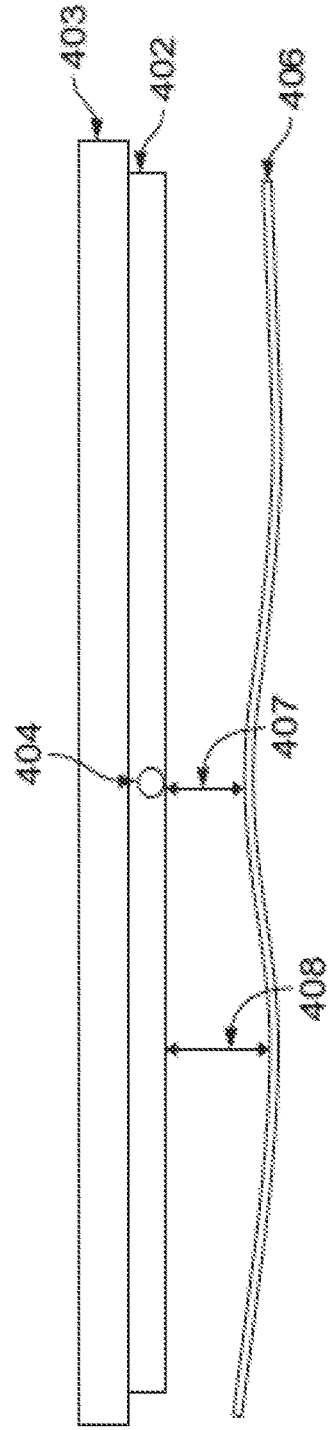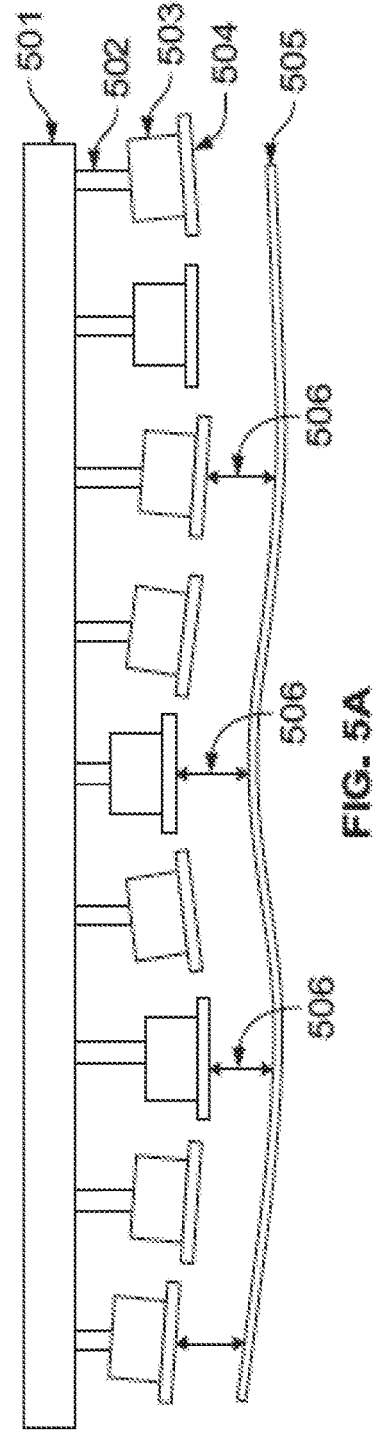
FIG. 4A
FIG. 4B
FIG. 5A

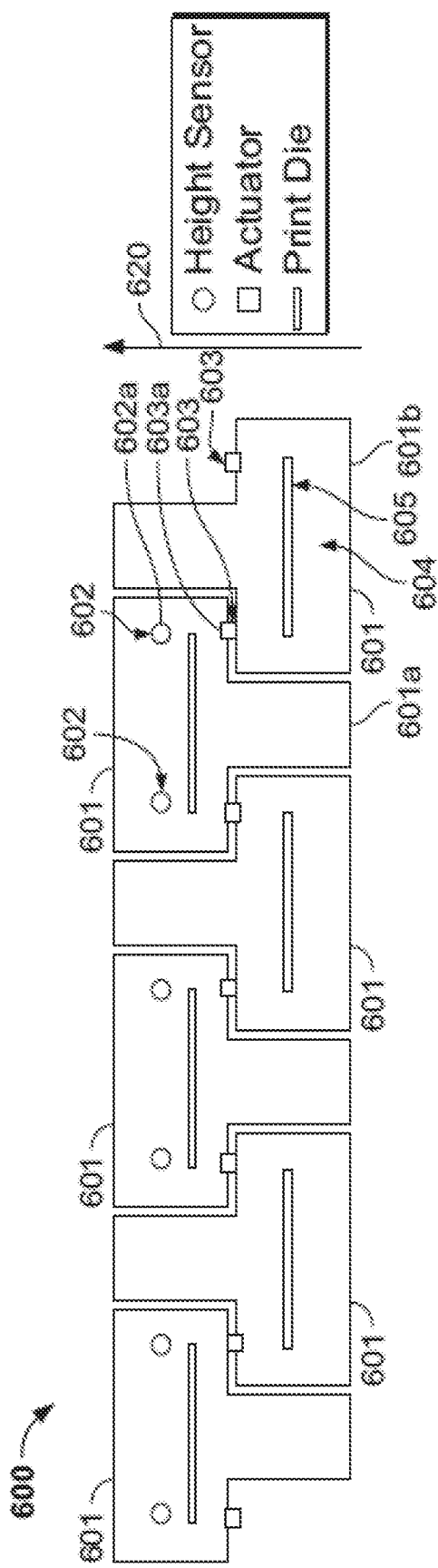
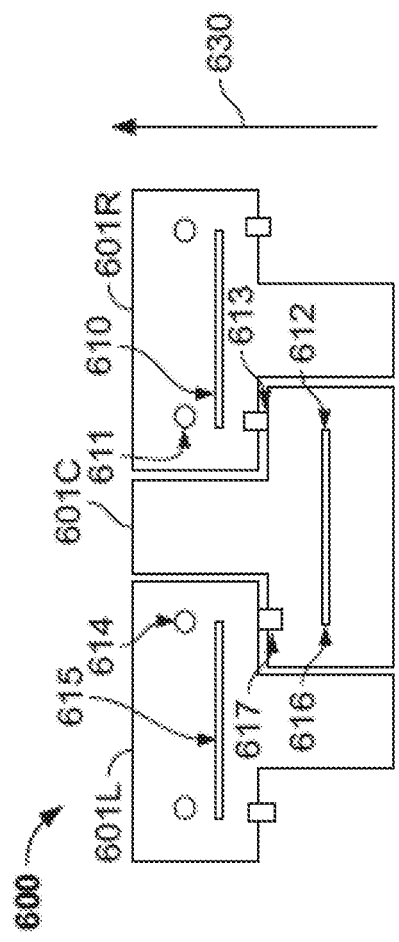
FIG. 6A
FIG. 6B

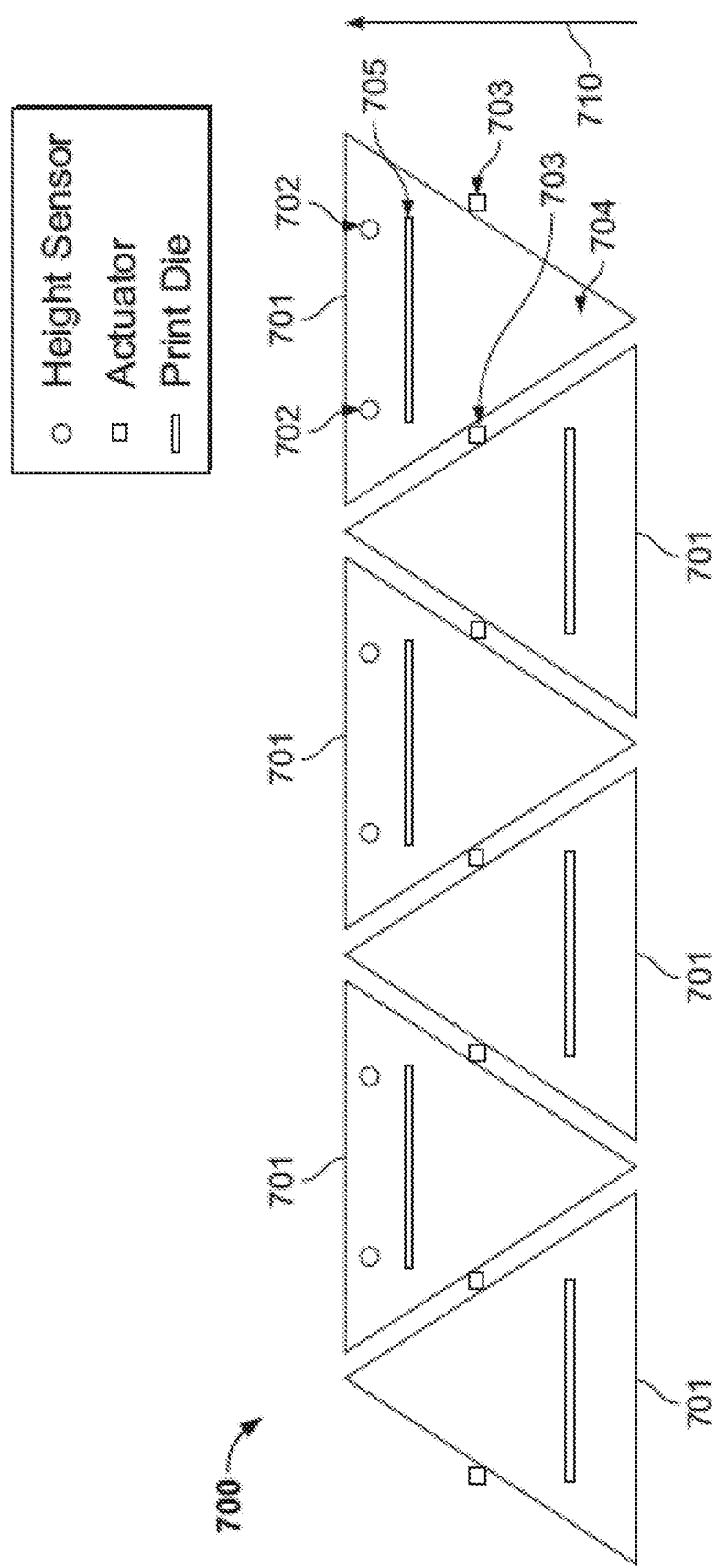

SEGMENTED OVJP PRINT BAR

CROSS-REFERENCE TO RELATED APPLICATIONS

This application is a non-provisional of and claims priority benefit to U.S. Provisional Patent Application Ser. No. 62/597,605, filed Dec. 12, 2017, and is related to U.S. patent application Ser. No. 15/968,009, filed May 1, 2018, the entire contents of each of which are incorporated herein by reference.

FIELD

The present invention relates to devices and techniques for fabricating relatively large-area devices including organic emissive layers, and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a print bar for organic vapor jet (OVJP) deposition is provided that includes a plurality of n print head segments, where each of the plurality of print head segments may have an OVJP print head. The print bar may include a plurality of distance sensors, where each of the plurality of distance sensors may be configured to measure a distance between a substrate disposed below the print bar and a portion of at least one of the print head segments. The print bar may include a plurality of not more than n+1 actuators configured to adjust at least one of a position and an orientation of one or more of the plurality of print head segments based upon one or more distances between the substrate and the print bar measured by one or more of the plurality of distance sensors. The print bar may include not more than n+1 distance sensors, and, in some implementations, may include not more than 2n+2 distance sensors, for n print head segments. Each of the plurality of print head segments of the print bar may have a chilled surface surrounding the OVJP print head.

The print bar may include at least one sensor to align the OVJP print head to one or more features disposed on the substrate. Each actuator of the plurality of actuators may be connected to and configured to control the at least one of the position and orientation of at least two of the plurality of print head segments. Each of the plurality of actuators may control the at least one of the position and orientation of the at least two of the plurality of print head segments based upon distance measurements obtained by at least one of the plurality of distance sensors. At least one of the position and orientation of each print head segment of the plurality of print head segments may be determined within its respective range of motion by two actuators of the plurality of actuators that are adjacent to each print head segment. Each joint between print head segments of the plurality of print head segments may be movable at least in a direction normal to the substrate independently of each other joint between print head segments such that the distance from the each joint between print head segments of the plurality of print head segments to the substrate is adjustable independently of the distance from each other joint between print head segments to the substrate.

The plurality of print head segments of the print bar may be arranged in two rows in a direction perpendicular to a direction of motion of the print bar relative to the substrate when the print bar is operated to deposit material on the substrate. The plurality of print head segments of the two rows may be offset from one another, where a first plurality of print heads in a first row are horizontally offset from a second plurality of print heads in a second row. At least one of the plurality of actuators may transfer motion to a rear corner of one printhead of the first plurality of printheads in the first row and to a front corner of another printhead of the second plurality of printheads in the second row. Each of the plurality of sensors associated with the first plurality of printheads of the first row may be associated with a different one of the plurality of actuators.

The first plurality of printheads and the second plurality of printheads may be surrounded by a fixed cold plate to form a chilled surface. The fixed cold plate that surrounds the first plurality of printheads and second plurality of printheads may have a plurality of fingers which are disposed between each of the first plurality of printheads and each of the second plurality of printheads. The plurality of fingers may be separated from the first plurality of printheads and the second plurality of printheads by a gap to permit motion.

The plurality of print head segments of the print bar may be disposed within the rows such that print areas of each row of corresponding OVJP print heads form a single printed column on the substrate when the print bar is operated to deposit material on the substrate. The plurality of print head segments of the print bar may have a staggered arrangement, where a first print head segment leads a second print head segment, and the second print head segment follows the first print head segment. A pair of the plurality of distance sensors and a pair of the plurality of actuators may serve the first print head segment and the second print head segment. The pair of the plurality of distance sensors and the pair of the plurality of actuators may be aligned so that a right edge of first print head segment is aligned with a left edge of the second print head segment.

The first print head and second print head may be T-shaped, and the second print head segment may have an orientation that is inverted with respect to the first print head segment. The first print head and second print head may be triangular, and the second print head segment may have an orientation that is inverted with respect to the first print head segment.

BRIEF DESCRIPTION OF THE DRAWINGS

FIGS. 4A and 4B show a schematic elevation view of a print head and substrate. FIG. 4A shows a print head and a uniform gap between a theoretical perfectly flat substrate. FIG. 4B shows a non-uniform gap between the print head and a substrate with non-perfect flatness.

FIG. 5A shows a segmented print bar according to embodiments disclosed herein, with articulated print heads disposed over a non-planar substrate that are capable of maintaining a constant or near constant print head to substrate distance.

FIG. 6A-6B show examples of a partial print bar according to embodiments disclosed herein having "T" shaped segments.

FIG. 7 shows an example of a partial print bar according to embodiments disclosed herein having triangular print head segments.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
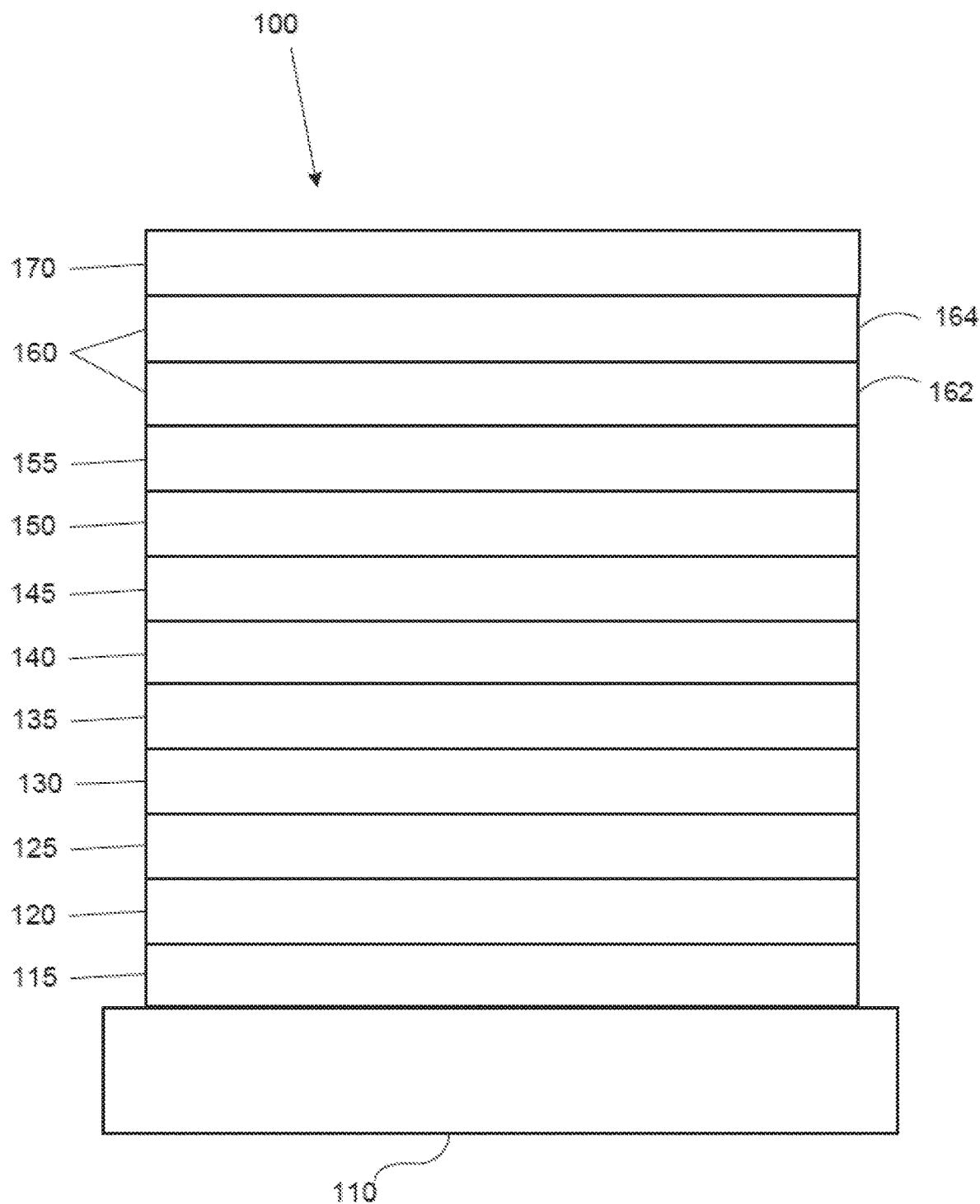
FIG. 1 shows an example of an organic light emitting device that can be fabricated using embodiments disclosed herein.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
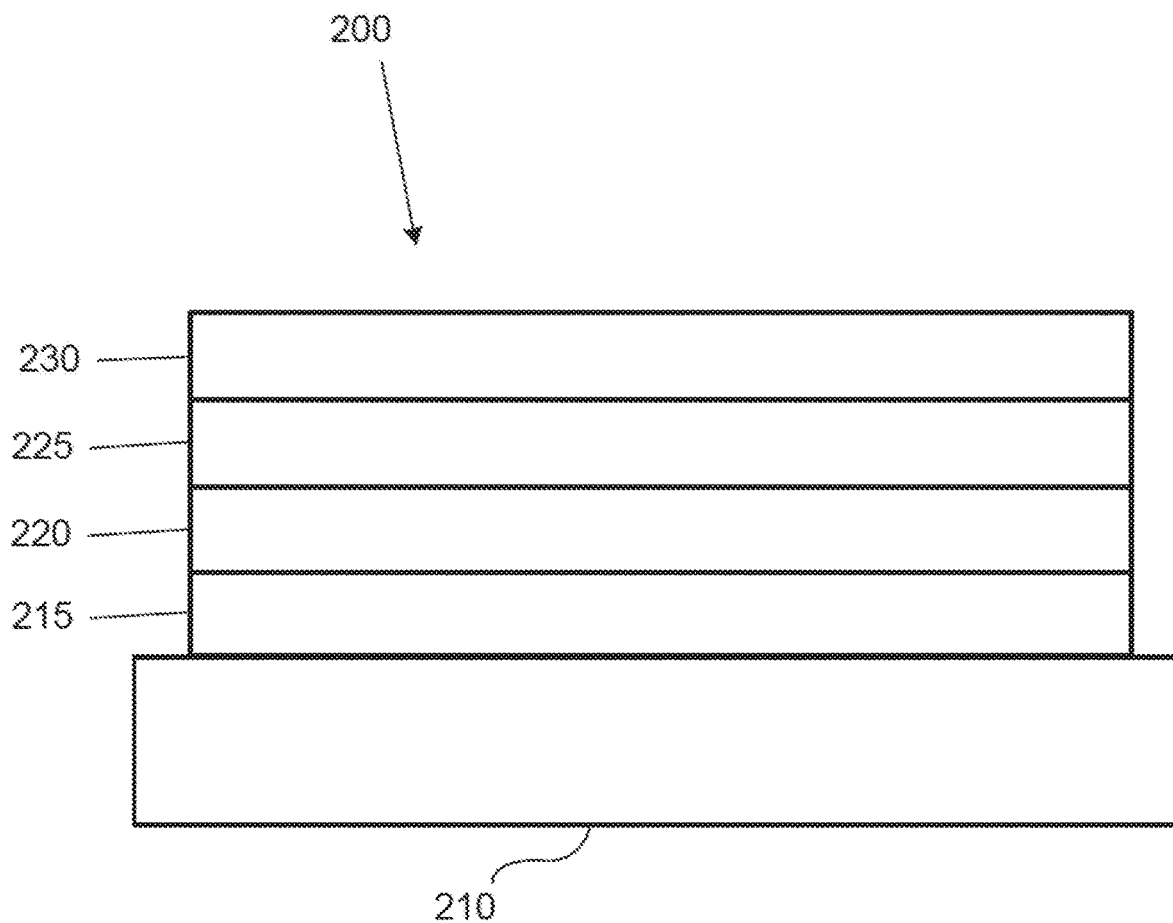
FIG. 2 shows an example of an inverted organic light emitting device that does not have a separate electron transport layer that can be fabricated using embodiments disclosed herein.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously discussed, OVJP is a mask-less, solvent-less printing technology for relatively large area OLED devices such as displays. In this technique, OLED materials are heated to evaporation or sublimation temperature and transported to a print head in a stream of carrier gas. Conventional OVJP print heads typically contain a number of apertures or nozzles that direct the vapor toward the substrate on which the OLED material is to be deposited. In display fabrication techniques, generally each aperture prints one row of display pixels. Print heads may be multiplexed to form print "bars" that span the width of the substrate such that all rows of pixels may be concurrently.

Figure 3A:
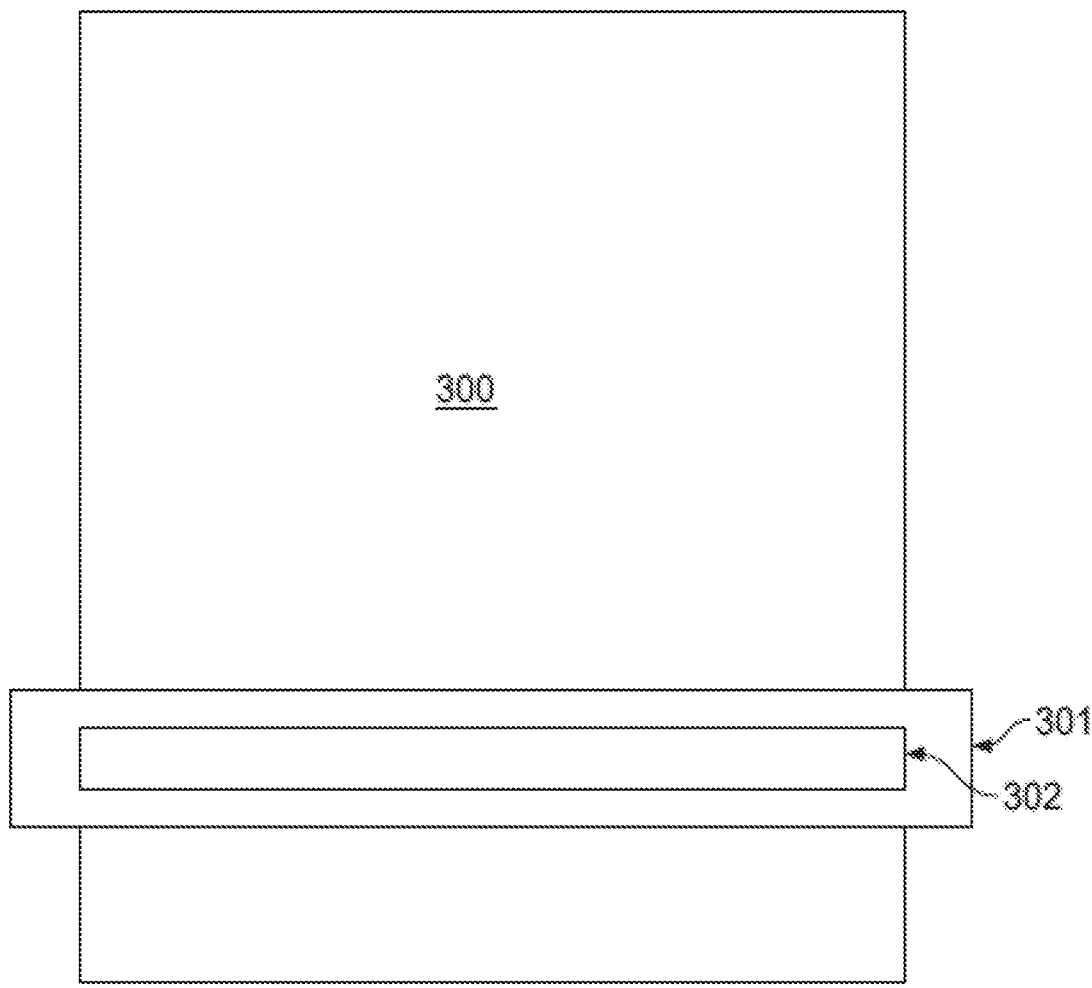
FIGS. 3A and 3B show a schematic of a current-generation substrate and an example single rigid print head used to print the entire substrate. The print head and support structure may be over 2.5 meters in length for processing of Gen 8 and larger substrates.
Figure 3B:
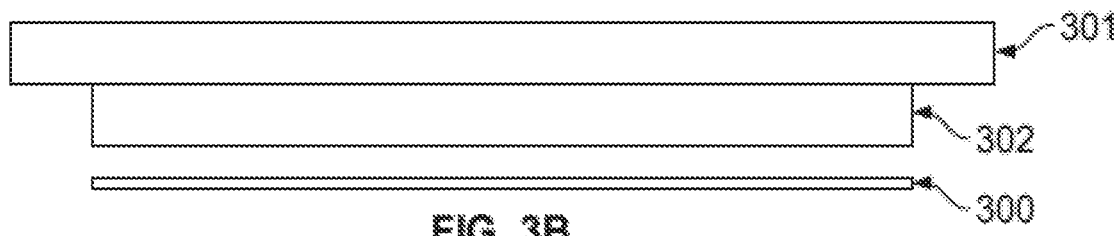

OVJP is primarily of interest currently as a research tool. However, OVJP techniques have demonstrated the required linewidth and across-pixel film thickness uniformity for use in manufacturing OLED displays that use a side-by-side RGB pixel format. In mass production systems, it is desirable to keep the time to complete a manufacturing step relatively low to maintain efficient overall production. The time between completed manufacturing steps is often referred to as the "TAKT" time. To achieve desirable TAKT time for OLED device production, a mass production OVJP printer may need to print multiple pixels or pixel rows in parallel. For example, the best TAKT time would be achieved if all rows of pixels were printed at the same time. As a specific example, a current 4K display would require 3,840 rows of pixels printed simultaneously, spanning the width of the display. Six 55-inch displays can be manufactured on a single current-generation 2.200 m by 2.500 m substrate. In this case, the OVJP deposition system would span the 2.2 meter width of the substrate and could print two displays or 7680 pixels simultaneously. FIG. 3A and FIG.

3B show an example of a current-generation ("Gen 8") substrate 300, a print head support structure 301, and a single monolithic print head 302 that spans the width of the display glass.

However, substrates used to manufacture devices such as large-panel displays are not perfectly flat, and a rigid print bar would not provide adequate control of the separation between the print heads and the substrate. Because of this, current OVJP-type techniques only allow for efficient and accurate deposition on a limited width of substrate in a single pass. For example, most conventional OVJP-type techniques are not suitable for deposition on large substrate, in some cases for substrates larger than about 0.5 m square or equivalent, without using rastering techniques. To deposit on larger substrates, current techniques typically use a single OVJP nozzle array that includes a large number of deposition apertures that is rastered across the substrate. For example, some configurations include up to 100 or more deposition apertures in the OVJP nozzle array. The nozzle array may include sensors and motion actuators to accurately maintain the gap between the substrate and the nozzle array assembly as a whole. Such techniques are much less sensitive to variations in fly height and thus to variations in substrate flatness. However, they also require complex management systems and have relatively very high TAKT times.

Thus, to achieve a desired pixel width using OVJP-type systems, it would be desirable for the distance between the substrate and the print head to be tightly controlled. To do so while accommodating variations in the flatness of the substrate, embodiments disclosed herein provide a "segmented print bar," which is a device having multiple segments connected to actuators that can move independent of each other to maintain the required distance between the print head and substrate. Each segment may include one or more OVJP print heads. Embodiments disclosed herein also may allow for significant movement of the print head only in the y-direction (in the substrate plane and perpendicular to the direction of movement of the substrate), whereas conventional OVJP systems require significant movement in both x- and y directions in order to raster the nozzle over the substrate. Prior to development of the embodiments disclosed herein, it has not been considered feasible to use OVJP-type techniques to print large-scale substrates as disclosed herein. Accordingly, prior and conventional systems excluded any consideration of fly height adjustment during material deposition, and did not include any mechanism for making such adjustments.

As a specific example, a 55-inch 4K display pixel is approximately 50 μm in width. Linewidths obtained using OVJP print heads are on the same order as the width of the jetting aperture and the distance from the jet head to the substrate. Accordingly, for OVJP techniques to attain a printing width of about 50 μm, the fly-height separation between the printing aperture, or print head, and the substrate should be accurately maintained to within +/−5 μm of the target fly-height or better. That is, the distance between the edge of the print head aperture and the closest surface of the substrate should vary by no more than +/−5 μm during deposition of material from the print head to the substrate. Deviations in fly height of more than +/−5 μm in either direction may widen the deposition line so that it impinges on neighboring pixels, or make the line thickness out of specification for the pixel size. To print a display on a current-generation glass substrate as previously disclosed with dimensions of 2.2×2.5 m, with a thickness of 0.5 mm, the print head would need to be at least 2.2 m long, as shown in FIG. 3A, and the glass would need to be planar to within +/−5 μm to maintain the proper fly height.

However, as previously noted, current-generation glass substrates are expected to have some variation in flatness of the surface. For example, current-generation display glass typically has a maximum deviation from a planar surface of about 40 μm. As a specific example, Corning indicates that Lotus NXT Glass® has the specifications shown in Table 1.

TABLE 1

| Maximum Size | Gen10 Substrate |
| --- | --- |
| Major Thicknesses | 0.3 mm, 0.4 mm, 0.5 mm, 0.6 mm, 0.7 mm |
| Thickness Tolerance | ±0.02 mm |
| Thickness Ranges (150 mm Moving Window) | ≤9 μm |
| Edges | R-Beveled |
| Corner Cuts | 1.5 ± 1.0 mm |
| Orientation Corners | Various |
| Squareness | ±0.3 mm |
| Sheet Warp | ≤0.20 mm |
| Waviness | Cut off: 0.8-8 mm ≤ 0.06 μm |
| | Cut off: 0.8-25 mm ≤ 0.33 μm |

As another example, Schott Glass provides the "moving window size" shown in Table 2, which is a measure of glass flatness.

TABLE 2

| Moving Window Size (mm) | Thickness Change (μm) |
| --- | --- |
| 150 | 9 (max) |
| 25 | 4 (max) |
| 10 | 1.1 (typ) |
| 5 | 0.7 (typ) |

Thickness range ± 20 μm over entire substrate

The specific values in Tables 1 and 2 are provided by way of example only, and one of skill in the art will recognize that the flatness specifications in Table 1 are for an older generation of substrate glass, while the values in Table 2 are for a current generation of substrate glass.

A flat printing bar that spans the width of such a display or a substrate will have a maximum deviation in print head-to-substrate distance equal to at least half the maximum substrate deviation, i.e., 20 μm in this example. Accordingly, a conventional one-piece solid print bar would not be capable of holding the desired separation of +/−5 μm during printing.

FIG. 4A shows a cross section of an example 2.2 m print head and a perfectly flat glass panel substrate. The print assembly 400 spans the width of the substrate 401. A support structure 403 for the print head 402 is wider than the substrate so that the print head can span the entire width of the substrate. The fly-height gap 405 between the substrate 401 and the print head 402 is uniform across the width of the substrate. However, as previously noted, real substrates are not perfectly flat and the gap will not be uniform across the width of the substrate. FIG. 4B shows a schematic example of a 2.2 m long print bar as previously disclosed, and a glass panel 406 having deviations in flatness of up to 40 μm. The resulting deviations from the ideal fly height are labeled at 407, 408. The variation in fly height is found to be in proportion to flatness specifications in Table 1.

As suggested by FIG. 4B, it has been determined that to maintain a proper fly height, the print head must be capable of conforming the topography of the substrate glass or otherwise adjusting to non-uniformities in the flatness of the substrate.

Embodiments disclosed herein provide a print bar having multiple segments, each including a print head, which can be translated (e.g., moved up and down relative to the substrate) and/or rotated (e.g., tilted relative to the substrate) individually and independently of one another. Distance sensors (i.e., fly height sensors) may measure the gap between a print die included in the segments of the print bar, and actuators may adjust the gap based on feedback from the sensors and optional sensors (e.g., vision sensors) that align the print dies to the features of a substrate. FIG. 5 shows an example of such a device, in which segmenting the print bar into smaller print heads that can be moved independently of one another allows the separation between the substrate and each print head to be maintained at a desired value. An edge-on schematic view of an example substrate is shown. Deviations to the flatness from planar are exaggerated, and a schematic profile of the segmented print bar shows how individual segments 502/503/504 articulate to follow the profile of the substrate.

As shown in FIG. 5, each segment may include a print head support structure 501, articulated mounting supports 502, print heads 503 and one or more aperture plates 504. Each articulated support structure may include movable elements that respond to one or more sensors in each print head that measure the distance from the print head to the substrate. Any suitable distance sensor may be used. For example, differential pressure, acoustic, capacitive, infrared, laser, ultrasonic, optical, and/or other sensor types may be used. As a specific example, a capacitive sensor as disclosed in co-pending U.S. application Ser. No. 15/968,166, filed May 1, 2018, the disclosure of which is incorporated by reference in its entirety, may be used. Data from each sensor may be provided to one or more of the print head segments and, based upon the measurement and the desired fly-height, the print head segment may be moved relative to the substrate to achieve a desired position and/or orientation of the print head relative to the substrate. Alternatively or in addition, a single sensor array or device may be used to measure the distance from each print head to the substrate. For example, a digital imaging or video system in conjunction with image recognition software may be used to identify and measure the position of each print head segment and provide feedback to the corresponding support structure. Based upon a distance measured by each sensor, the moving elements move the associated print head to maintain a constant distance 506 between the bottom of the print head, such as the bottom aperture plate 504, and the substrate 505. Furthermore, each segment also may be tilted relative to the substrate, such as to maintain a deposition aperture parallel to the substrate or a major axis of a deposition nozzle perpendicular to the substrate. In general, each print head may be oriented independently of each other print head so as to maintain it in the desired orientation at the desired distance from the substrate.

Each print head may include a fully-functional OVJP nozzle or similar deposition device. For example, each segment may include one or more printing apertures defined in a hard, inflexible material to maintain their shapes. For example, materials such as a metal, ceramic or silicon may be appropriate. Each aperture may be a rectangular gas outlet or it may have an arbitrary shape to produce a desired printed profile. It also may be formed by multiple smaller apertures configured in a unique pattern to print each line.

Each print head segment also may contain vacuum ports and apertures to remove carrier gas and excess organic material. Vacuum ports may be made in the same material as the gas outlet apertures.

Each print head segment may include a heater or may be in thermal contact with a heater to prevent condensation of the organic materials.

Organic vapor, carrier gas and vacuum ports may be connected to their respective sources or pumps via appropriate tubing for transport.

More generally, each print head segment may include an OVJP print head and any necessary components and connections to operate as a fully-functional print head independently of each other print head in the segmented print bar.

In some embodiments, some or all of the individual print heads may be in fluid communication with common vacuum sources, organic material sources, or the like, or each print head may be in communication with separate sources.

In some embodiments, each print head segment may include two or more sensors to measure the distance between each end of the print head and the substrate, thereby allowing for more precise positioning and alignment of the segment relative to the substrate.

Figure 5B:
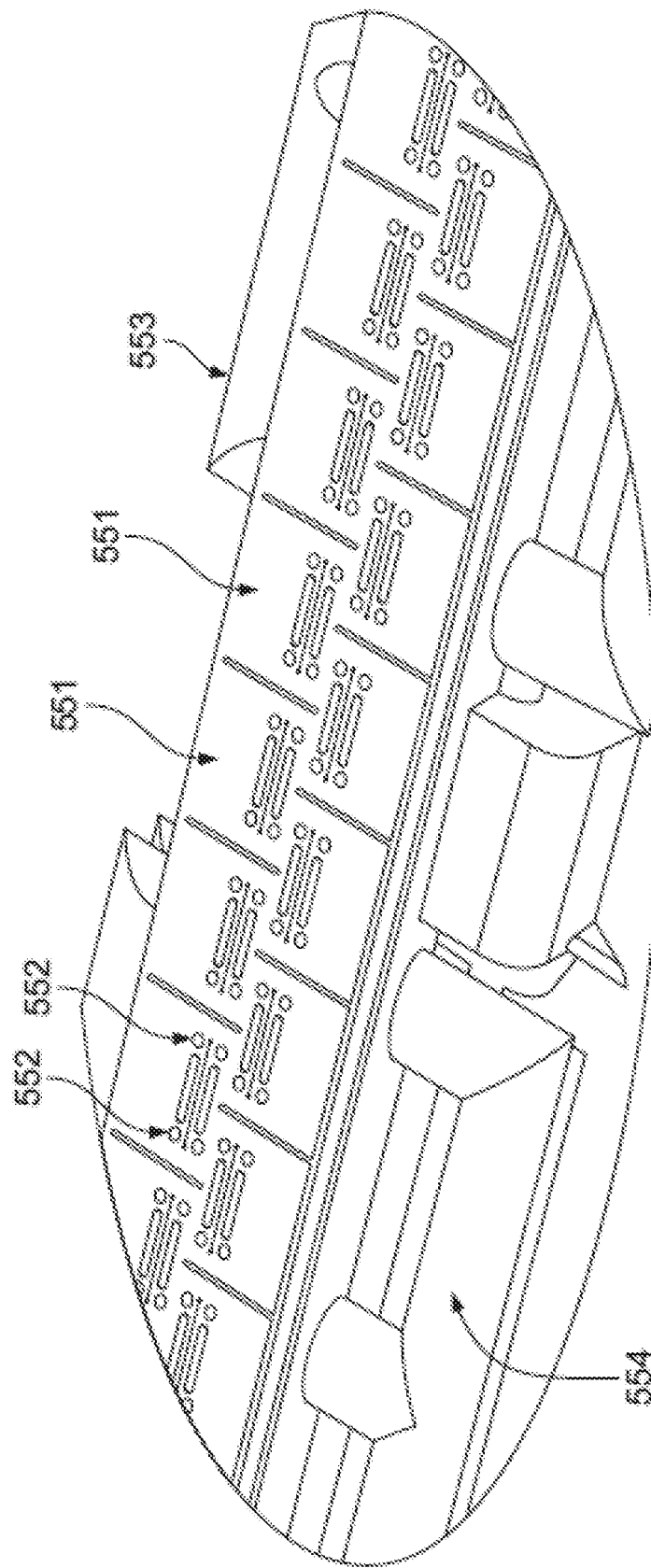
FIG. 5B shows an example print bar with two rows of print heads according to embodiments disclosed herein, in which printing apertures of each row of print heads are arranged so that a complete row is printed with no overlap of printing apertures and no gaps between alternating rows of print heads.

A segmented print bar as disclosed herein may include gaps between adjacent segments. In some embodiments, gaps between segments may be filled by a second row of print head segments which are offset compared to the first row to fill the gaps. FIG. 5B illustrates a two row print bar with equal length print segments. Individual print heads 551 with integrated height sensors 552 are arranged in two rows 553, 554 so that printing zones of each row will print lines of pixels with no overlap and no gaps. Supply of organic material and or vacuum for the print heads may be supplied by a common source, by individual sources, or combinations thereof as previously disclosed. Arranging the print bars sequentially as shown in FIG. 5B also may provide additional room for vertical actuators and for small adjustment in the distance between print heads to accommodate manufacturing tolerances in the substrate backplane or for thermal expansion of the substrate. A staggered arrangement also may allow space for manifolds to mount the print die in the segment. The manifolds typically are wider than the dies they carry, so they cannot be placed immediately adjacent to each other without leaving one or more pixel rows unprinted. By staggering two rows of the print die, a complete display may be printed in a single pass without leaving any pixel rows unprinted.

In some embodiments, the width of a print head segment may be determined by the local area flatness of the substrate, for example by a moving window size as shown in Table 2 and/or a waviness value as shown in Table 1. Such dimensions may be used to determine a minimum, optimal, or acceptable size of an individual print head in a segmented device as disclosed herein. More generally, the maximum width of a print segment typically can only be as long as the distance on the substrate that has a height variation equal to the fly height tolerance. For example, using the values from Table 2 as an example, a print bar with a 150 mm print segment would be within the +/−5 μm tolerance with the given 9 μm (max) thickness change.

More generally, in embodiments disclosed herein, a print die length may be determined based on the fly height requirement of the print head design, the resolution required by a display design, and the local area flatness of the glass substrate. For current-generation Gen8-type glass, a typical print die length may be in the range of 75 to 100 mm.

Figure 5C:
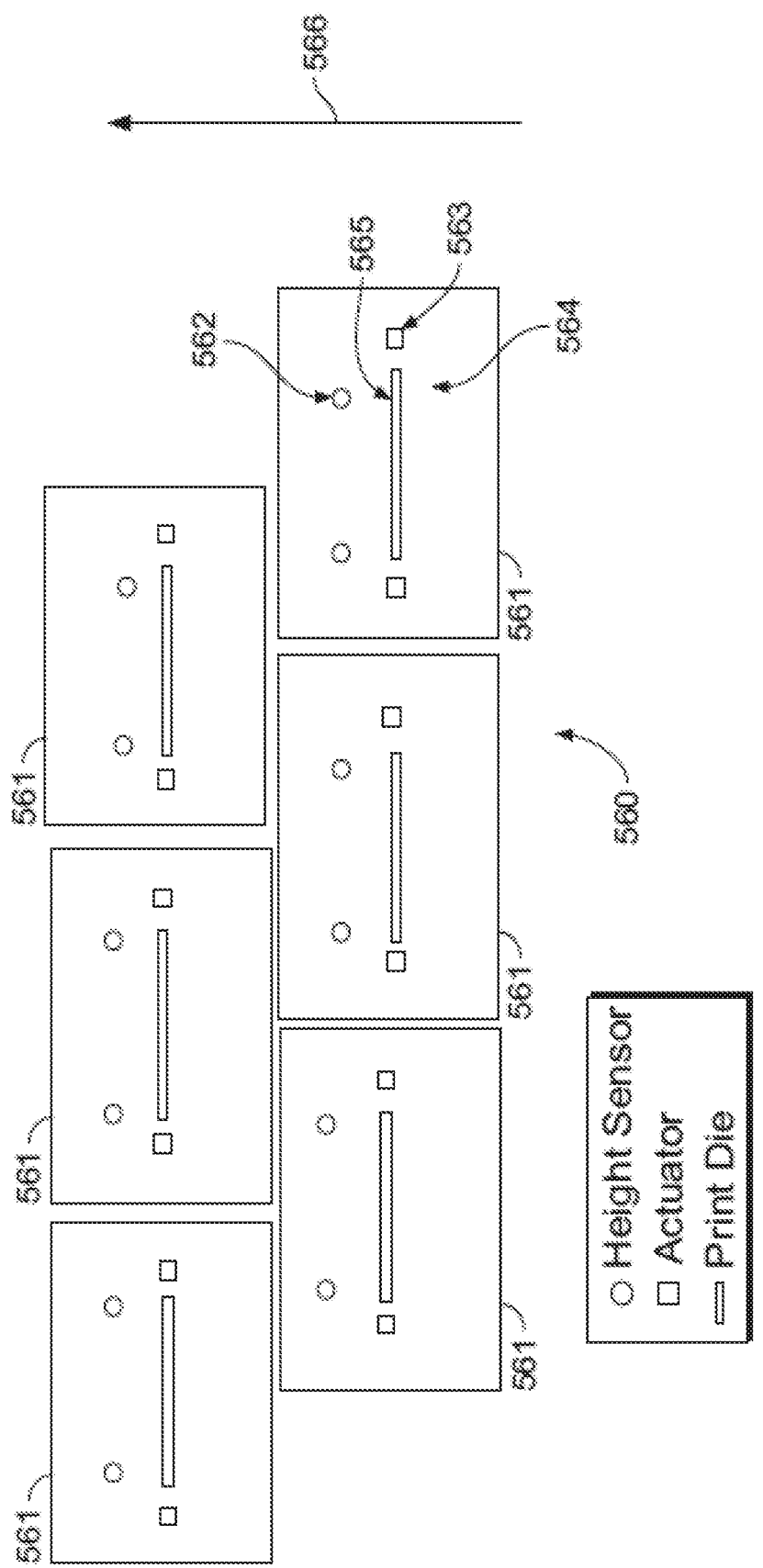
FIG. 5C shows a schematic illustration of a rectangular print bar including rectangular segments as shown in FIG. 5B.

Embodiments such as those shown in FIGS. 5B and 5C include rectangular print head segments. Each rectangular print head segment may include one or more distance sensors to measure the gap between the print die and substrate as previously disclosed, one or more actuators to adjust the gap between the segment and the substrate based on feedback from the sensors, and one or more other sensors, such as visual sensors, which may be used to align the print die to the features on the substrate.

For example, FIG. 5C show a schematic representation of a segmented print bar 560 as disclosed herein, as viewed from above the print head in a direction toward the substrate (not shown), or from the surface of the substrate looking along a line normal to the substrate toward the print head 560. The segmented print bar 560 may include one or more segments 561 as previously disclosed, each of which may be rectangular in shape. The substrate-adjacent surface of each print bar segment may be thermally isolated from the print head and may be chilled to form chilled surface 564 and act as a heat shield 564 that prevents the heated elements of the print bar 560 from overheating the substrate. In the example arrangement shown, each segment includes two fly height sensors 562, two fly height actuators 563 (which may be disposed above the print segment surface relative to the substrate thus may not be visible when viewed from the substrate) and a print die 565. As used herein, a print die such as the print die 565 may include deposition, exhaust, confinement and other gas apertures. Such a die may be fabricated, for example, in silicon using MEMS microfabrication techniques. The segments 561 and the print die 565 may be arranged so that there are no gaps in the printed area as a substrate is moved relative to the print bar 560 in the direction 566. The chilled surface 564 may be continuous except for small gaps between segments.

In some embodiments, fewer sensors and actuators and/or smaller segments may be used. In addition, the motion of the leading and trailing print head segments may be coupled. Such arrangements may provide a reduction in space, complexity and cost for a large scale OVJP system.

For example, in some embodiments, the print head segments may be different shapes and/or placed in different arrangements that allow a single sensor to be used for two segments, one leading and one following, using the same staggering concept as previously shown and described with respect to FIGS. 5B and 5C. Segment surfaces form chilled surfaces which may limit the radiation of heat from the hot print die and other heated parts of the print head to the substrate. Any large gaps between segments may allow too much thermal damage to the substrate and it may be desirable to minimize such gaps. Thus, the surface of a segmented print bar as disclosed may perform during operation of the system as a continuous chilled surface, while still providing sufficient degrees of movement to follow the surface of the substrate and maintain a constant or essentially constant fly height as previously disclosed.

FIG. 6A shows an example segmented print bar according to an embodiment disclosed herein, in which each segment 601 has a "T" shape. The segments 601 are configured so that each fly height sensor 602 and actuator pair 603 serves two print die 605—one leading die and one following die in the staggered arrangement, with the direction of movement 620 relative to the substrate defining which die are considered "leading" and "following" relative to other die. That is, during operation of the OVJP deposition system, each fly height sensor may provide distance information for two segments, and/or each actuator 603 may be used to adjust the distance and/or orientation of two segments relative to the substrate. As a specific example, a fly height sensor 602a may provide height information that may be used to adjust an actuator 603a to control the distance and/or tilt of the two segments 601a, 601b shown in FIG. 6A. Aligning the fly height distance sensors 602, actuators 603, and edges of print die 605 may allow for more precise and accurate control of the position of the print die 605 relative to the substrate than other configurations. For example, by aligning two fly height sensors 602 with the ends of the print die 605 and positioning the actuators 603 in a similar location on the other side of the print die 605, the positioning of each end of the print die 605 may be precisely controlled based on distance measurements that are likely to accurately represent the distance of each end of the print die 605 from the substrate. A chilled surface 604 may provide a limitation on radiation of heat from the print die 605 as previously described in connection with at least FIG. 5C.

FIG. 6B shows sensors 611 and actuators 613 that may be aligned with the edges of print die 612. For example, the right edge of the leading die and the left edge of the following die may be aligned. The direction of movement 620 relative to the substrate may define which die is considered "leading" and "following" relative to other die. For example, in FIG. 6B, the right most segment 601R may include print die 610, fly height sensor 611, and actuator 613. The fly height sensor 611, left edge of the print die 610 and the actuator 613 may be aligned along the print direction. The following die 612 may be included in segment 601C and the right edge of print die 612 may be aligned with the left edge of die 610. Actuator 613 may be connected to segments 601L and 601C. The left most segment 601L may include print die 615, fly height sensor 614 and actuator 617. The following print die 615 (i.e., which follows edge 616 of the print die 612) may be included in segment 601L and the left edge of print die 612 (i.e., edge 616) may be aligned with the right edge of die 615. Actuator 617 may be connected to segments 601L and 601C. Each segment may be shaped like a "T" with leading segments upright and trailing segments inverted. This configuration may provide full cold plate coverage, and the edge of neighboring segments may not extend to the middle of neighboring print die, which allows for more tilt without having the segment edge contact the substrate. A configuration such as this may reduce the number of sensors and actuators and allows for greater segment tilt.

FIG. 7 shows another example of a segmented print bar 700 according to embodiments disclosed herein. This example uses triangular print head segments 701. Similar to the configurations shown in FIGS. 5A-6B, the print head 700 may include one or more height sensors 702, actuators 703, and print die 705. The print head 700 may include a chilled surface 704. Height sensors and/or actuators may be "shared" among adjacent segments as previously disclosed. In operation, the segmented print bar 700 may be moved in a direction 710 relative to the substrate, i.e., such that the print dies 705 and the top/bottom edges of the triangular print head segments 701 are perpendicular or essentially perpendicular to the direction of movement. A configuration as shown in FIG. 7 may be desirable in some designs and for some applications due to the potentially greater compactness of the segmented print bar. However, although the triangular segments are potentially more compact than the rectangular segments previously disclosed herein, they may not provide as much tilt capability as "T" shaped segments and similar designs as described with respect to FIGS. 6A-6B.

Figure 8:
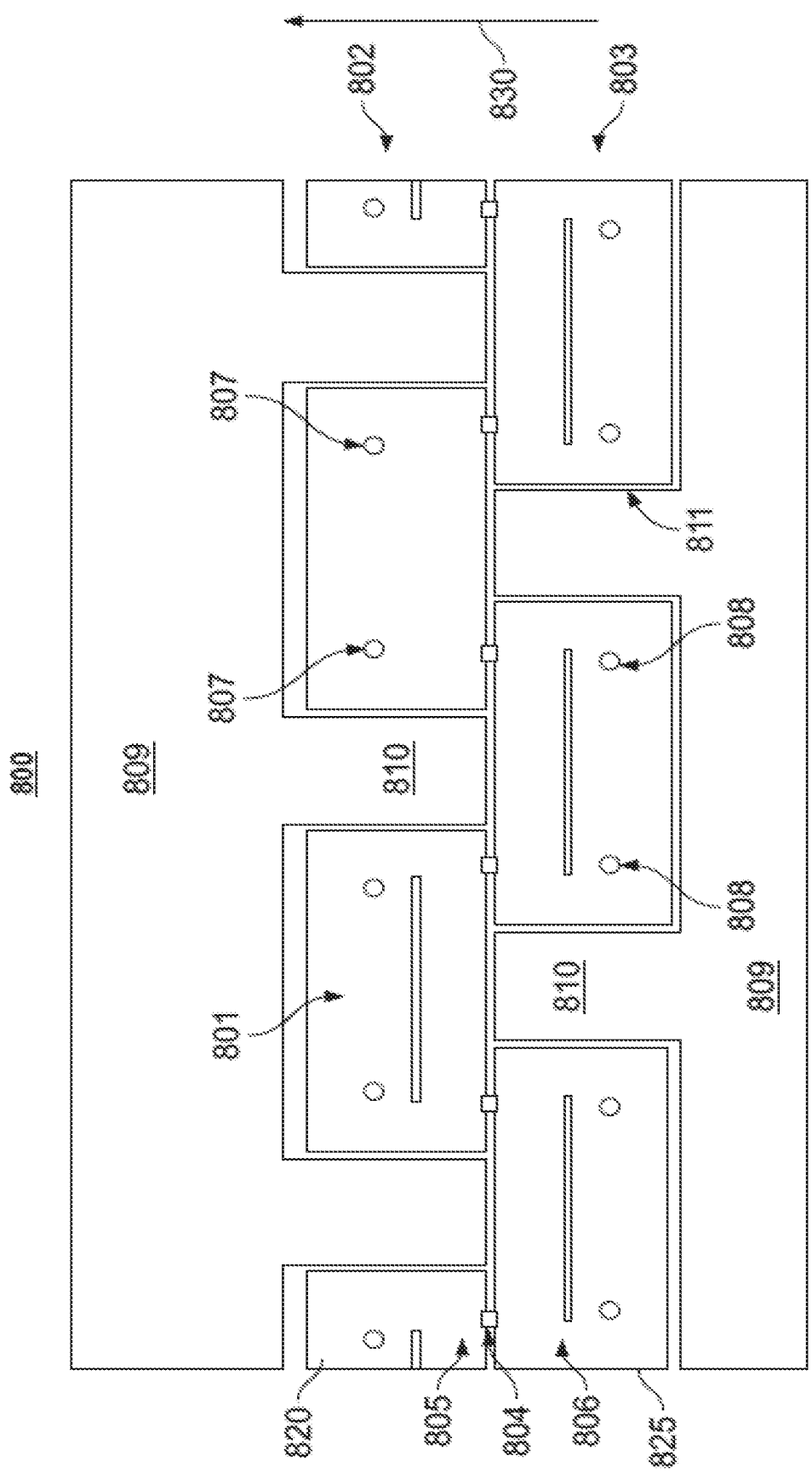
FIG. 8 shows an example of a print bar with leading and trailing cold plates with rectangular segments according to embodiments disclosed herein.

FIG. 8 shows another arrangement of a segmented print bar 800 according to embodiments disclosed herein. In this arrangement, rectangular-face print heads 801 may be arranged in multiple ranks, with front heads 802 and rear heads 803 disposed in a lapped arrangement such that the individual print heads partially overlap the direction of printing motion 830 relative to the substrate. As with previously-disclosed arrangements, actuators 804 and fly height sensors 807, 808 may be used to adjust the distance and tilt of individual print head segments relative to the substrate. For example, in the arrangement shown in FIG. 8, each actuator 804 may transfer vertical motion to a rear corner 805 of a front-rank print head 820 and a front corner 806 of a rear-rank print head 825. As in other arrangements disclosed herein, the articulations connecting each actuator to the two print heads it services may be disposed in line with the edges of the two print dies along the printing direction. Furthermore, fly height sensors 807 on the front-rank print heads 820 may each be associated with a different actuator, as previously disclosed in other arrangements, and in line with an associated actuator along the printing direction. A second set of fly height sensors 808 may be disposed on the rear-rank print heads. This second set of fly height sensors 808 may improve the performance of the segmented print head bar in bidirectional operation, since it allows the print heads to respond similarly to changes in substrate height relative to the depositors, regardless of whether the substrate is moving forwards or rearwards relative to the bar during printing. The print head segments may be surrounded by a fixed cold plate 809 disposed to the front and/or rear of the segmented print heads. The cold plate may include extended portions 810 ("fingers") on the front and/or rear edges that interdigitate with the staggered line of print heads as shown. Such an arrangement covers the regions between the cold plates associated with each of the individual print head segments and may further protect the substrate from heat generated by the OVJP mechanism. The cold plate fingers may be separated from the print heads by small gaps 811 to permit motion of the segmented print heads as previously disclosed.

As used herein, when a print bar or other OVJP deposition apparatus and a substrate are described as being moved in a direction relative to each other or moved in a relative direction, such as the directions 620, 710, 830, and the like, it will be understood that such motion may be accomplished by moving the print bar or apparatus and holding the substrate stationary, moving the substrate while holding the deposition apparatus stationary, or moving both components so as to achieve the desired relative motion.

According to embodiments shown in FIGS. 5C-8, a print bar (e.g., print bar 560 shown in FIG. 5C; print bar 600 shown in FIGS. 6A-6B; print bar 700 shown in FIG. 7; and/or print bar 800 shown in FIG. 8) for organic vapor jet (OVJP) deposition is provided that includes a plurality of n print head segments (e.g., segments 561 shown in FIG. 5C; segments 601 shown in FIG. 6A; segments 601L, 601C, 601R shown in FIG. 6B; segments 701 shown in FIG. 7; and/or segments 801 shown in FIG. 8) where each of the plurality of print head segments may have an OVJP print head (e.g., print die 565 shown in FIG. 5C; print die 605 shown in FIG. 6A; print die 610, 612, and/or 615 shown in FIG. 6B). The print bar may include a plurality of distance sensors (e.g., fly height sensors 562 shown in FIG. 5C; fly height sensor 602 shown in FIG. 6A; fly height sensor 611, 614 shown in FIG. 6B; height sensor 702 shown in FIG. 7; and/or fly height sensors 807, 808 shown in FIG. 8), where each of the plurality of distance sensors may be configured to measure a distance between a substrate disposed below the print bar and a portion of at least one of the print head segments. The print bar may include a plurality of not more than n+1 actuators (e.g., fly height actuators 863 shown in FIG. 5C; actuator 603 shown in FIG. 6A; actuators 613, 617 shown in FIG. 6B; actuator 7003 shown in FIG. 7; and/or actuator 804 shown in FIG. 8) configured to adjust at least one of a position and an orientation of one or more of the plurality of print head segments based upon one or more distances between the substrate and the print bar measured by one or more of the plurality of distance sensors.

The print bar may include not more than n+1 distance sensors, and, in some implementations, may include not more than 2n+2 distance sensors, for n print head segments. More than n+1 sensors may be arranged linearly on each side of the print bar to permit bidirectional motion of the substrate in a direction perpendicular to the lines of sensors. For example, a portion of the bidirectional motion may include directions 566 shown in FIG. 5C, direction 620 shown in FIG. 6A, direction 630 shown in FIG. 6B, direction 710 shown in FIG. 7, and/or direction 830 shown in FIG. 8. Another portion of the bidirectional motion may be opposite the directions, 566, 620, 630, 710, and/or 830.

Each of the plurality of print head segments of the print bar may have a chilled surface surrounding the OVJP print head. For example, the chilled surface may be chilled surface 564 shown in FIG. 5C, chilled surface 604 shown in FIG. 6A, and/or chilled surface 704 shown in FIG. 7. The print bar may include at least one sensor to align the OVJP print head to one or more features disposed on the substrate. Each actuator of the plurality of actuators may be connected to and configured to control the position and/or orientation of at least two of the plurality of print head segments. This configuration may reduce the number of actuators, while providing for adjustment of position, tilt, and/or orientation of the print head segments. The position and/or orientation of the at least two of the plurality of print head segments may be controlled by the actuators based upon distance measurements obtained by at least one of the distance sensors.

At least one of the position and/or orientation of each print head segment of the plurality of print head segments may be determined and/or positioned within its respective range of motion by two actuators that are adjacent to each print head segment. Each pair of print head segments may be movable by an actuator that is that is connected to the pair of segments at or near the articulation connecting the two segments. Each actuator may move independently to adjust the distance between the print head segments and the substrate at its point of attachment to the print bar. Each actuator may change the position of the two print head segments located around it. Two actuators may uniquely determine the position and orientation of a print head segment. The position of each actuator may determine the position and/or orientation of the other print bar segment to which it is attached. In implementations of the disclosed subject matter, print head segments may not be adjustable independently of the neighboring print head segments.

The plurality of print head segments of the print bar may be arranged in two rows in a direction perpendicular to a direction of motion of the print bar relative to the substrate when the print bar is operated to deposit material on the substrate. As discussed above in connection with FIG. 8, the two row arrangement may include front heads 802 and rear heads 803. The plurality of print head segments of the two rows may be offset from one another, where a first plurality of print heads in a first row are horizontally offset from a second plurality of print heads in a second row. As shown in FIG. 8, front heads 802 and rear heads 803 may be disposed in a lapped arrangement such that the individual print heads partially overlap in a direction of movement 830 relative to the substrate.

At least one of the plurality of actuators may transfer motion to a rear corner of one printhead of the first plurality of printheads in the first row and to a front corner of another printhead of the second plurality of printheads in the second row. For example, as shown in FIG. 8, each actuator 804 may transfer vertical motion to a rear corner 805 of a front-rank print head 820 and a front corner 806 of a rear-rank print head 825. The plurality of sensors (e.g., sensors 807 shown in FIG. 8) associated with the first plurality of printheads of the first row (e.g., front heads 802 shown in FIG. 8) may be each associated with a different one of the plurality of actuators (e.g., actuators 804 shown in FIG. 8).

The first plurality of printheads (e.g., front heads 802 shown in FIG. 8) and the second plurality of printheads (e.g., rear heads 804 shown in FIG. 8) may be surrounded by a fixed cold plate (e.g., cold plate 809 shown in FIG. 8) to form a chilled surface. The fixed cold plate that surrounds the first plurality of printheads and second plurality of printheads may have a plurality of fingers (e.g., extended portions 810 shown in FIG. 8) which may be disposed between each of the first plurality of printheads and each of the second plurality of printheads. The plurality of fingers may be separated from the first plurality of printheads and the second plurality of printheads by a gap to permit motion of the printheads.

The plurality of print head segments of the print bar may be disposed within the rows (see, e.g., printhead segments 561 in FIG. 5C that are in rows, and/or front heads 802 and rear heads 803 arranged in rows as shown in FIG. 8) such that print areas of each row of corresponding OVJP print heads form a single printed column on the substrate when the print bar is operated to deposit material on the substrate. The plurality of print head segments of the print bar may have a staggered arrangement, where a first print head segment leads a second print head segment, and the second print head segment follows the first print head segment (e.g., the arrangement of printhead segments 561 as shown in FIG. 5C). A pair of the plurality of distance sensors and a pair of the plurality of actuators may serve the first print head segment and the second print head segment. The pair of the plurality of distance sensors and a pair of the plurality of actuators may be aligned so that a right edge of first print head segment is aligned with a left edge of the second print head segment, as shown and described above in connection with, for example, FIGS. 6A-6B. The first print head and second print head may be T-shaped, and the second print head segment may have an orientation that is inverted with respect to the first print head segment, such as shown in FIGS. 6A-6B and described above. The first print head and second print head may be triangular, and the second print head segment may have an orientation that is inverted with respect to the first print head segment, such as shown in FIG. 7 and described above.

Embodiments disclosed herein provide a segmented OVJP-type print bar that includes multiple independent several print heads that may be suspended from a rigid support structure. The print bar segments provide the full functionality of a large print bar while solving the inability of a single monolithic print bar to maintain a constant print head-to-substrate distance. Segmenting the print bar into multiple discrete print heads as disclosed herein, each of which has a range of movement in the direction of the substrate, provides the ability of the print system to compensate for the non-planarity of OVJP-suitable substrates.

Furthermore, a segmented print bar as disclosed herein also may have more relaxed tolerances required for the print head bar itself when compared to conventional print heads or a single print head bar used to deposit over the same surface area. For example, a very large print head bar (e.g., 1-2 m long or more) with a flatness tolerance of +/−5 μm or less and a similarly tight depositor placement tolerance from end to end would be exceedingly difficult if not impossible to create using conventional techniques. In contrast, using a segmented print bar as disclosed herein allows for individual segments that may be sized to meet the required tolerances. For example, components having dimensions of 150 mm and smaller may be made by well-understood semiconductor fabrication techniques. Individual segments may be registered to features on the substrate directly, making the process more tolerant to additive tolerance errors in both the print head and substrate.

A segmented print bar as disclosed herein also may be advantageous in comparison to a single linear print bar because the print head-to-substrate separation may be maintained over substrates that are not perfectly planar. As disclosed herein, when the print head to substrate distance is not maintained at a constant desired value, the line width and deposition thickness may change and the deposition may not be to specification, or even of sufficient tolerance to provide acceptable or even poor performance. In general, the deposited line becomes too wide if the separation is too large, and the thickness becomes too great if the separation is reduced. Maintaining a correct separation therefore may be essential to producing a printed line with the desired width and thickness to achieve large-scale OLED fabrication.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A print bar for organic vapor jet (OVJP) deposition, the print bar comprising:
    a plurality of n print head segments, each of the plurality of print head segments comprising an OVJP print head, wherein n is a positive integer with a value that is greater than or equal to 1;
    a plurality of distance sensors, each of the plurality of distance sensors configured to measure a distance between a substrate disposed below the print bar and a portion of at least one of the print head segments; and
    a plurality of not more than n+1 actuators configured to adjust at least one of a position and an orientation of one or more of the plurality of print head segments based upon one or more distances between the substrate and the print bar measured by one or more of the plurality of distance sensors.

2. The print bar of claim 1, wherein the print bar comprises not more than n+1 distance sensors for n print head segments.

3. The print bar of claim 1, wherein the print bar comprises not more than 2n+2 distance sensors for n print head segments.

4. The print bar of claim 1, wherein each actuator of the plurality of actuators is connected to and configured to control the at least one of the position and orientation of at least two of the plurality of print head segments.

5. The print bar of claim 4, wherein each of the plurality of actuators controls the at least one of the position and orientation of the at least two of the plurality of print head segments based upon distance measurements obtained by at least one of the plurality of distance sensors.

6. The print bar of claim 1, wherein at least one of the position and orientation of each print head segment of the plurality of print head segments determined within its respective range of motion by two actuators of the plurality of actuators that are adjacent to each print head segment.

7. The print bar of claim 6, wherein each joint between print head segments of the plurality of print head segments is movable at least in a direction normal to the substrate independently of each other joint between print head segments such that the distance from the each joint between print head segments of the plurality of print head segments to the substrate is adjustable independently of the distance from each other joint between print head segments to the substrate.

8. The print bar of claim 1, wherein the plurality of print head segments are arranged in two rows in a direction perpendicular to a direction of motion of the print bar relative to the substrate when the print bar is operated to deposit material on the substrate.

9. The print bar of claim 8, wherein the plurality of print head segments of the two rows are offset from one another, wherein a first plurality of print heads in a first row are horizontally offset from a second plurality of print heads in a second row.

10. The print bar of claim 9, wherein at least one of the plurality of actuators transfers motion to a rear corner of one printhead of the first plurality of printheads in the first row and to a front corner of another printhead of the second plurality of printheads in the second row.

11. The print bar of claim 9, wherein each of the plurality of sensors associated with the first plurality of printheads of the first row are associated with a different one of the plurality of actuators.

12. The print bar of claim 9, wherein the first plurality of printheads and the second plurality of printheads are surrounded by a fixed cold plate to form a chilled surface.

13. The print bar of claim 12, wherein the fixed cold plate that surrounds the first plurality of printheads and second plurality of printheads has a plurality of fingers which are disposed between each of the first plurality of printheads and each of the second plurality of printheads.

14. The print bar of claim 13, wherein the plurality of fingers are separated from the first plurality of printheads and the second plurality of printheads by a gap to permit motion.

15. The print bar of claim 8, wherein the plurality of print head segments are disposed within the rows such that print areas of each row of corresponding OVJP print heads form a single printed column on the substrate when the print bar is operated to deposit material on the substrate.

16. The print bar of claim 1, wherein the plurality of print head segments have a staggered arrangement, wherein a first print head segment leads a second print head segment, and the second print head segment follows the first print head segment.

17. The print bar of claim 16, wherein a pair of the plurality of distance sensors and a pair of the plurality of actuators serve the first print head segment and the second print head segment.

18. The print bar of claim 17, wherein the pair of the plurality of distance sensors and the pair of the plurality of actuators are aligned so that a right edge of first print head segment is aligned with a left edge of the second print head segment.

19. The print bar of claim 16, wherein the first print head and second print head are T-shaped, and the second print head segment has an orientation that is inverted with respect to the first print head segment.

20. The print bar of claim 16, wherein the first print head and second print head are triangular, and the second print head segment has an orientation that is inverted with respect to the first print head segment.

* * * * *